US 6,583,510 B2

(12) United States Patent
Hanamaki et al.

(10) Patent No.: US 6,583,510 B2
(45) Date of Patent: Jun. 24, 2003

(54) SEMICONDUCTOR DEVICE WITH VARYING THICKNESS GOLD ELECTRODE

(75) Inventors: Yoshihiko Hanamaki, Tokyo (JP); Toshio Tanaka, Tokyo (JP); Tohru Takiguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/915,269

(22) Filed: Jul. 27, 2001

(65) Prior Publication Data

US 2002/0113279 A1 Aug. 22, 2002

(30) Foreign Application Priority Data

Feb. 19, 2001 (JP) .......................... 2001-041188

(51) Int. Cl.[7] .......................... H01L 23/48; H01L 23/52; H01L 29/40
(52) U.S. Cl. .......................... 257/775; 257/94
(58) Field of Search .......................... 257/775, 4, 94, 257/79; 372/46

(56) References Cited

U.S. PATENT DOCUMENTS 4,974,232 A * 11/1990 Morinaga et al. .............. 372/46
4,974,233 A * 11/1990 Suzuki et al. .................. 372/46
5,422,307 A * 6/1995 Ishii .............................. 437/184

FOREIGN PATENT DOCUMENTS

| JP | 02-37783 | * | 2/1990 |
| JP | 5-114763 A |   | 5/1993 |
| JP | 08-78701 | * | 3/1996 |
| JP | 2001-53025 | * | 2/2001 |

OTHER PUBLICATIONS

Sakaino et al.; "Uncooled and Directly Modulated 1.3μm DFB Laser Diode for Serial 10Gb/s Ethernet", *ECOC 2000 Abstract*, vol. 1, pp. 125–126.

"7.2.2. Reduce parasitic impedance of devices", Semiconductor Laser [Fundamentals and Applications], Baifukan (Publisher), pp. 157–159, ISBN 4–563–034371.

* cited by examiner

Primary Examiner—Phat X. Cao
(74) Attorney, Agent, or Firm—Leydig, Voit & Mayer, Ltd.

(57) ABSTRACT

An electrode for a semiconductor device includes a gold-containing thin film and a gold-containing plated film on the thin film. The plated film covers the entire thin film. No open surface is present between the thin gold film and the gold plating so no excessive current concentration occurs in any area.

11 Claims, 5 Drawing Sheets

PRIOR ART

SEMICONDUCTOR DEVICE WITH VARYING THICKNESS GOLD ELECTRODE

BACKGROUND OF THE INVENTION

1. Field of the Invention

The present invention relates to a semiconductor device and a method of forming an electrode of the semiconductor device, and more particularly, to an electrode structure indispensable for an optical device or an electronic device. More particularly, the present invention relates to an electrode structure effective for effecting flow of an electric current to an electrode having a particularly small area, as well as to a method of manufacturing the electrode structure.

2. Background Art

In relation to general optical devices or electronic devices, when power is supplied to a device from the outside thereof, an electrode used for power supply is required. For instance, in the case of an optical device, an electrode is formed on a semiconductor doped with n-type or p-type impurities at a doping level of $1 \times 10^{19}/cm^3$ or more, that is, a contact layer. In the case of an n-type electrode, a thin gold film of, e.g., AuGeNi, TiAu, or CrAu, is formed on the contact layer through vacuum deposition. In the case of a p-type electrode, a thin gold film of, e.g., AuZn, is formed on the contact layer through vacuum deposition. The thus-formed thin gold film is plated with gold. The reasons for the electrode assuming such a stacked structure are that ohmic contact must be established between the electrode and the semiconductor and that the strength of the electrode must be increased.

FIG. 5 is a schematic representation showing a related-art optical device.

The optical device is provided with, as an electrode structure for enabling flow of a current to the optical device, a thin gold film 13 (having a thickness of 40 to 300 nm) and gold plating (having a thickness of 2,000 through 3,000 nm).

Different material is used for the gold thin film 13, depending on the conductivity type of a semiconductor adjoining the gold thin film 13. For instance, if a p-type semiconductor adjoins the thin gold film 13, AuZn (having a thickness of 40 to 300 nm) is employed. If an n-type semiconductor adjoins the thin gold film 13, AuGeNi, TiAu, or CrAu (each having a thickness of 50 to 200 nm) is used.

As shown in FIG. 5, gold plating 114 is formed on the thin gold film 13, except at the edge of a device. The gold plating 114 is not formed up to the edge of the device. The reason for this is that, if the thick gold plating 114 were formed up to the edge of the device, difficulty would be encountered in cleaving the device. In this case, the thin gold film 13 is larger in area than the gold plating 114, and hence a surface of the thin gold film 13 appears.

An insulating film 12 (having a thickness of about 200 nm) is formed below an electrode material such that an electric current flows to only an area of a contact layer 11 (having a thickness of 600 nm) of a semiconductor. Any type of material can be used for the insulating film 12, so long as the material has high resistivity. $SiO_2$ or SiN is usually employed as the insulating film 12. In some cases, a semiconductor material having high resistivity is used.

The current that has flowed into the contact layer 11 flows to an active layer 4, passes through a substrate having conductivity opposite that of the semiconductor, and finally reaches an underside electrode 1 (having a thickness of 1,000 nm).

An electrode is important for a semiconductor device. However, when an electric current flows to the device by way of the electrode, the electric current concentrates at the boundary surface between the thin gold film 13 and the gold plating 114, because of a difference in specific resistance between the thin gold film 13 and the gold plating 114. More specifically, the thin gold film 13 differs in conductivity from the gold plating 114, and hence there arises an area in the boundary surface where current concentrates excessively. As shown in FIG. 6, there may sometimes arise a case where a thin gold film 100 located on a boundary surface of the semiconductor (i.e., the contact layer 11) is melted by the Joule heat resulting from excessive concentration of an electric current.

The problems of the related-art have been described by taking an optical device as an example. Similar problems are expected to arise in an electronic device having an electrode structure in which gold plating is formed on the thin gold film or in an electronic device in which a thin gold film is greater in area than gold plating.

SUMMARY OF THE INVENTION

The present invention has been conceived to solve the problems and is aimed at preventing melting of an electrode, which would otherwise be induced by excessive concentration of an electric current.

A semiconductor device with an electrode for power supply is disclosed.

According to one aspect of the resent invention, the electrode of the semiconductor device has a gold-containing thin film and a gold-containing plating formed on the thin film, and the entire thin film is covered with the plating.

According to another aspect of the present invention, the electrode of the semiconductor device is formed by means of forming a gold-containing plating on the entire surface of a gold-containing thin film.

Other and further objects, features and advantages of the invention will appear more fully from the following description.

DETAILED DESCRIPTION OF THE PREFERRED EMBODIMENTS

Preferred embodiments of the present invention will be described hereinbelow by reference to the accompanying drawings. The present invention will be described by taking an optical device as an example. The foregoing problems are expected to arise in all types of electronic devices having an electrode structure in which gold plating is formed on a thin gold film and the thin gold film is greater in area than the gold plating. Hence, an electrode structure put forward in the following embodiments can be applied to all types of optical devices and electronic devices having an electrode structure in which a gold thin film is plated with gold.

The present invention is effective when applied to a case where an electric current is caused to flow into an electrode structure having a particularly small area. The following embodiments will be described by taking, as an example, a semiconductor optical device which usually involves an electrode of small area and a large inflow elecric current. For instance, even when the range of the present invention is expanded to general electronic devices; e.g., DRAM, SRAM, or CPUs, an electrode plays the same role. Hence, the range of the present invention extends over general electronic devices.

FIRST EMBODIMENT

Figure 1A:
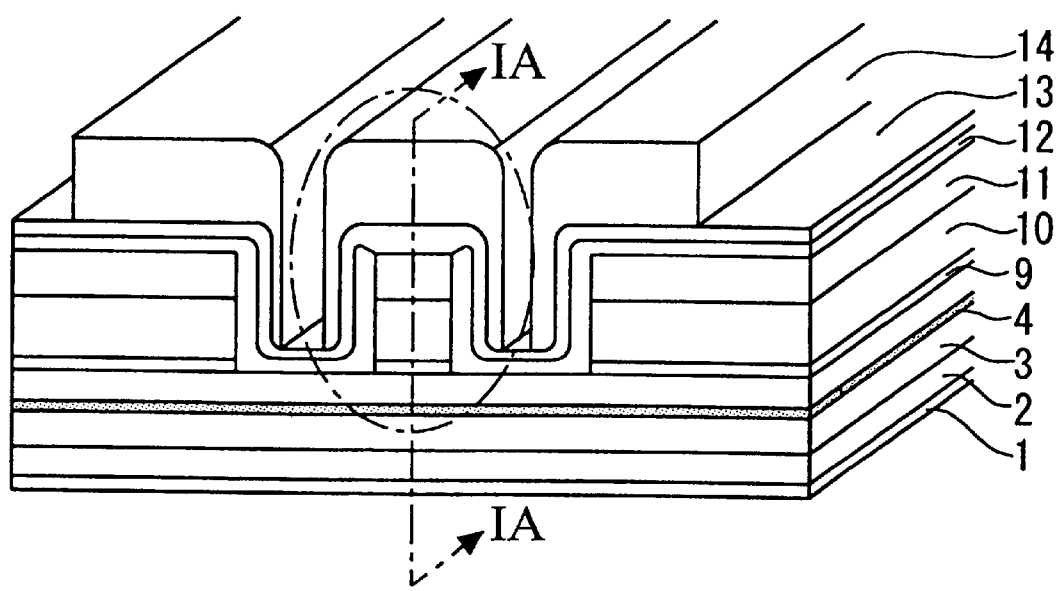
FIG. 1A is an illustration showing the structure of a semiconductor optical device according to a first embodiment of the present invention and FIGS. 1B and 1C are detail views.

FIG. 1A is an illustration showing the structure of a semiconductor optical device according to a first embodiment of the present invention. The semiconductor optical device shown in FIG. 1A is a ridge waveguide semiconductor laser manufactured through use of the known technique. A semiconductor substrate—on which a laser structure is formed through epitaxial growth—is of arbitrary conductivity type. The general characteristic of the present invention is not lost even when semiconductor material of arbitrary type (e.g., InP, GaAs, or Si) is used for a substrate or a laser structure.

For the sake of convenience, manufacturing processes will be described by taking, as an example, an AlGaInAs ridge laser formed on an n-InP substrate. First, an n-InP buffer layer 3 (having a thickness of 0.3 to 1.0 $\mu$m) and an n-AlGaInAs BDR layer 4 (having a thickness of 0.05 to 0.1 mm) are formed through epitaxial growth, on an n-InP single crystal substrate 2 formed on the underside electrode 1.

Figure 1B:
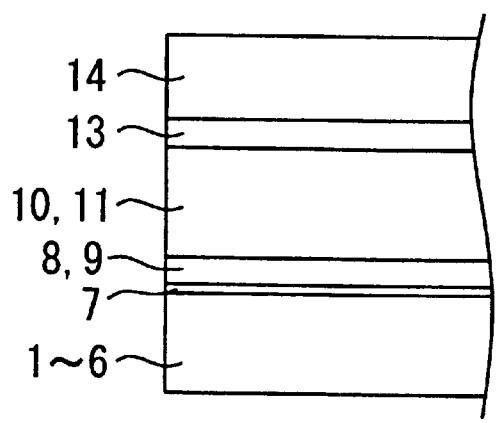
Figure 1C:
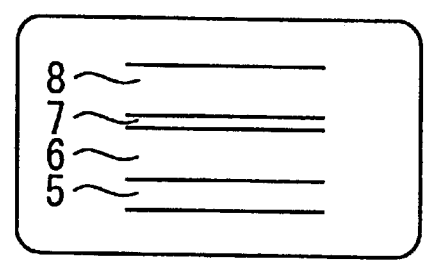

An n-AlInAs optical confinement layer 5 (having a thickness of 0.05 to 0.1 $\mu$m), an n-AlGaInAs GRIN layer 6 (having a thickness of 0.75 to 1.25 $\mu$m), an AlGaInAs MQW structure 7, and an AlGaInAs GRIN layer 8 (having a thickness of 0.75 to 1.25 $\mu$m) are further formed on a wafer through epitaxial growth. Subsequently, a p-AlInAs layer 9, a p-InP layer 10 (having a thickness of 1 to 2 $\mu$m), and p-InGaAs contact layer 11 (having a thickness of 0.5 to 1.0 $\mu$m) are formed through epitaxial growth, thereby completing manufacture of an epitaxial wafer. This structure is further illustrated in the sectional view of FIG. 1B taken along line IB—IB of FIG. 1A and the end view of FIG. 1C.

Subsequently, known ridge laser wafer processes are performed. First, an insulating film 12 (having a thickness of 50 to 200 nm) is formed from, e.g., SiO$_2$, so as to cause an electric current to flow to only the contact layer 11. A thin gold film 13 (having a thickness of 200 to 300 nm) is deposited on the insulating film 12, and gold plating 14 is further deposited on the thin gold film 13.

Figure 5:
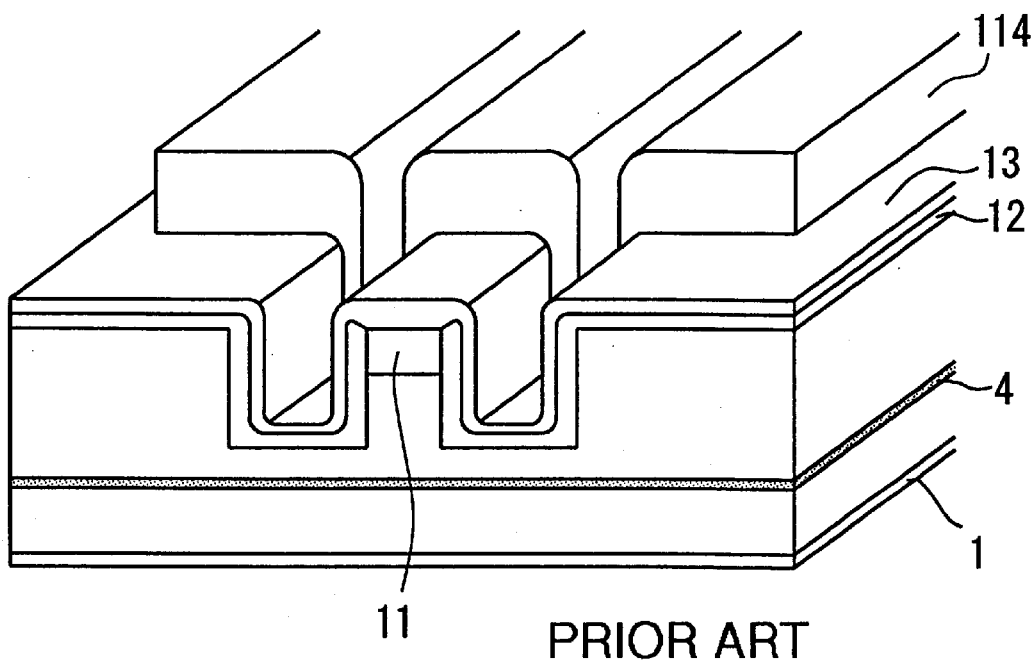
FIG. 5 is a schematic representation showing a related-art optical device.

As shown in FIG. 5, according to the related-art ridge laser wafer processes, gold plating 114 (having a thickness of 2000 to 3000 nm) is deposited on the thin gold film 13 partially (except the edge of a device). In the first embodiment, the gold plating 14—which is thinner (e.g., has a thickness of 150 nm) than that formed in the related-art ridge laser wafer processes—is deposited over the entire surface of the thin gold film 13.

As a result, an open surface of the thin gold film 13 not covered by the gold plating 14 disappears. Therefore, excessive concentration of an electric current is avoided and fusion of an electrode is prevented.

Figure 6:
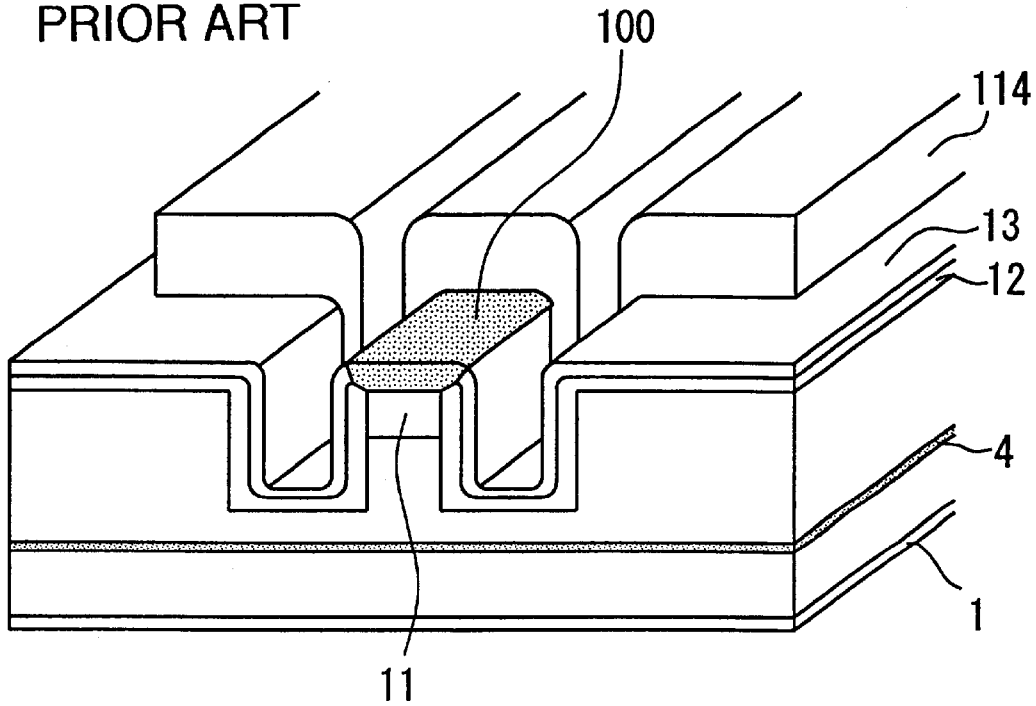
FIG. 6 is an illustration showing the problems of the related-art.

In the semiconductor device having the foregoing construction (i.e., a laser diode shown in FIG. 1A), electrons and positive holes implanted by way of the upper electrode 14 and the lower electrode 1 are re-combined together by a quantum well 7, thereby inducing laser oscillation. At this time, no open surface of the thin gold film 13 exists, thereby eliminating an area at which an excessive current concentrates and preventing fusion of an electrode of the ridge structure shown in FIG. 6.

In the first embodiment, the gold plating 14 (having a thickness of 150 nm or thereabouts) is formed thinner than the related-art gold plating 114 (having a thickness of 2,000 through 3,000 nm). Even when the gold plating 14 is deposited up to the edge (cleavage) of the device, cleaving of the edge of the device can be readily effected.

The present embodiment has described a case where the gold plating 14 is formed thinner than the related-art gold plating 114. However, alternatively, the gold plating 14 may be formed narrower than the related-art gold plating 114. Even in this case, even when the gold plating 14 is deposited up to the edge of the device, cleaving of the edge of the device can be readily effected. As a matter oc course, the gold plating 14 may be made both thinner and narrower than the related-art gold plating 114.

SECOND EMBODIMENT

Figure 2A:
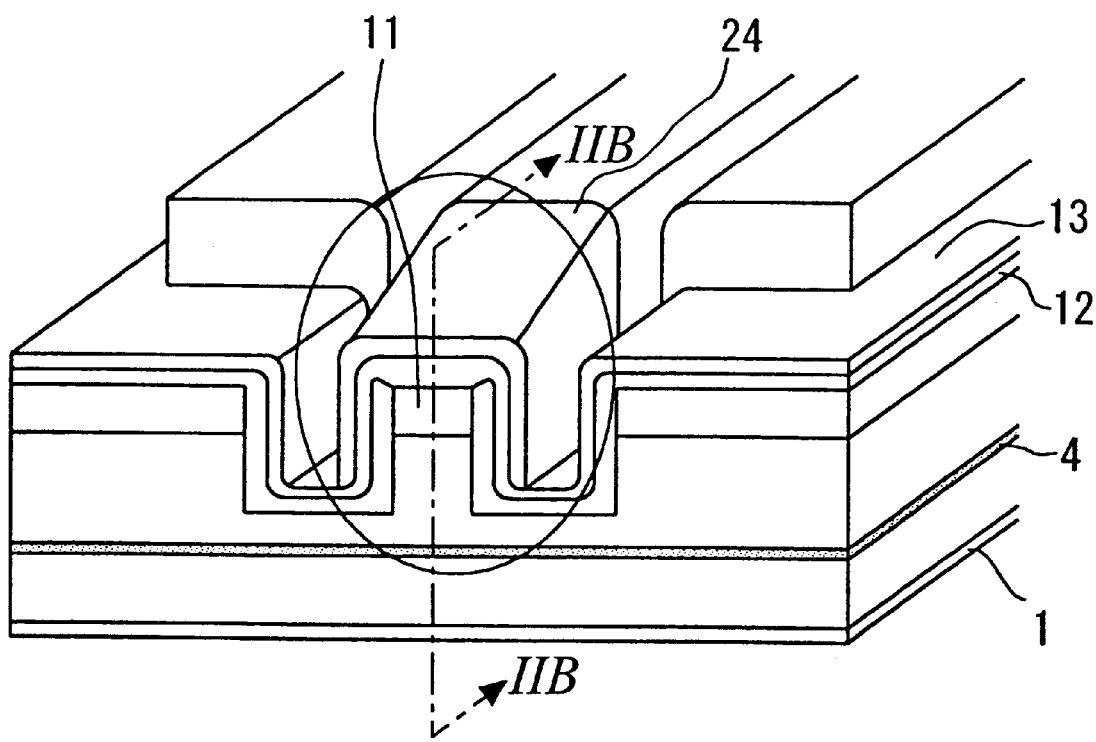
FIG. 2A is an illustration showing the structure of a semiconductor optical device according to a second embodiment and 2B is a detail view.
Figure 2B:
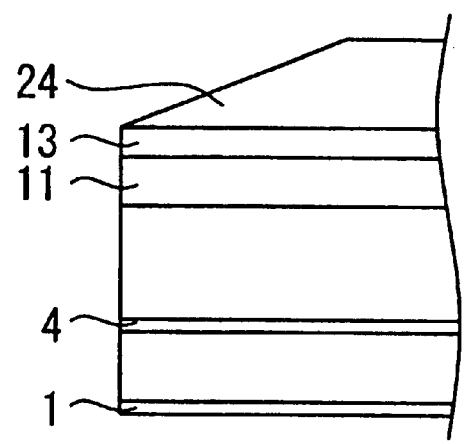

FIG. 2A is an illustration showing the structure of a semiconductor optical device according to a second embodiment of the present invention. FIG. 2B is a cross-sectional view taken along line IIB—IIB of FIG. 2. The semiconductor optical device shown in FIG. 2A is a ridge waveguide semiconductor laser manufactured through use of the known technique. Procedures through manufacture of an epitaxial wafer for a ridge laser and procedures through production of the thin gold film 13 are the same as those in the first embodiment, and repeated explanation thereof is omitted. In relation to the structure of the device, elements which are the same as those described in connection with the first embodiment are assigned the same reference numerals, and illustration of the elements is omitted. Only the area around the structure of gold plating is shown in detail.

Even in the second embodiment, gold plating 24 is deposited over the entire thin gold film 13. When the gold plating 24 is deposited on the thin gold film 13, the gold plating section 24 is tapered from the top of the ridge to the edge of the device, and the edge of the device is formed to, e.g., a thickness of 150 nm or less.

As a result, an open surface of the thin gold film 13 disappears, thereby eliminating, from the thin gold film 13, an area at which an electric current concentrates excessively, thus preventing occurrence of a failure, which would otherwise be caused by fusion of the thin gold film 13.

The gold plating 24 formed at least at the edge of the device is thinner than a corresponding area of the relate-art gold plating 114. Even when the gold plating 24 is deposited up to the edge of the device, cleaving of the edge of the device can be readily effected. The gold plating 24 can be made narrower or both narrower and thinner than the related-art gold plating 114.

In the second embodiment, the gold plating 24 is not made thin over the entire thin gold film 13; the gold plating 24 is thinner at the edge of the device than at the remaining portions of the gold plating 24. As a result, there is yielded an advantage of ability to realize ohmic contact between the elecrode and the semiconductor and ensure sufficient strength of an electrode structure.

THIRD EMBODIMENT

Figure 3A:
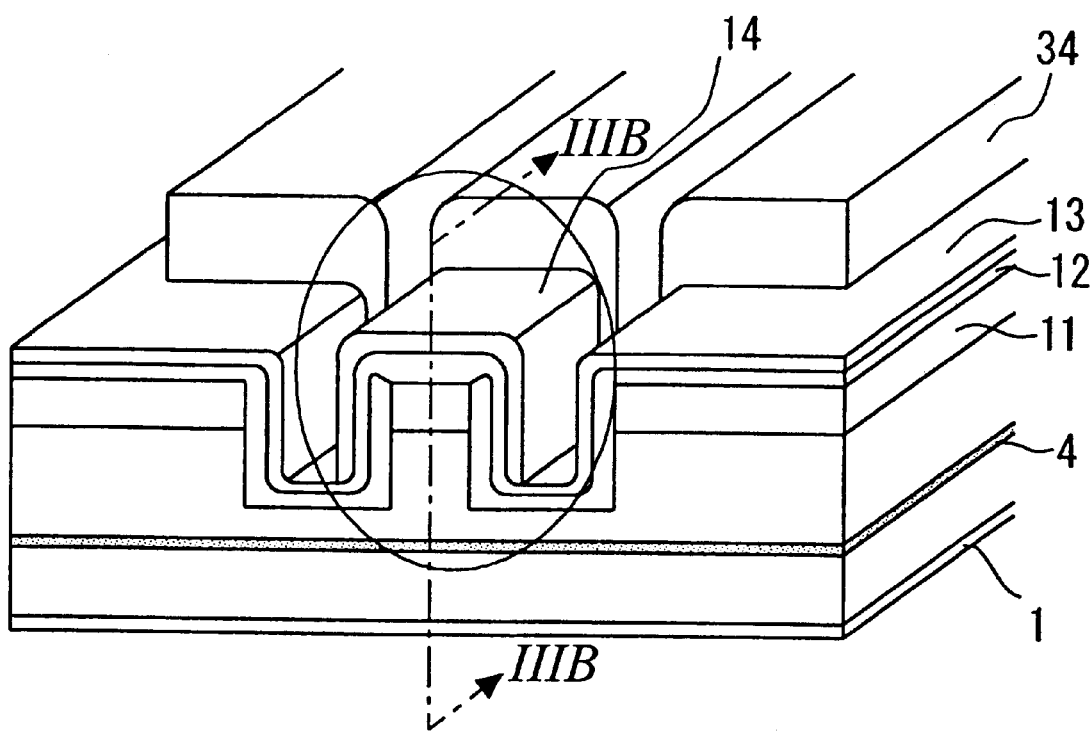
FIG. 3A is an illustration showing the structure of a semiconductor optical device according to a third embodiment and FIG. 3B is a detail view.
Figure 3B:
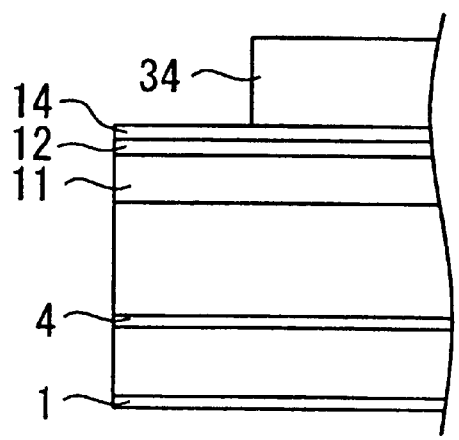

FIG. 3A is an illustration showing the structure of a semiconductor optical device according to a third embodiment of the present invention. FIG. 3B is a cross-sectional view taken along line IIIB—IIIB of FIG. 3A. The semiconductor optical device shown in FIG. 3A is a ridge waveguide semiconductor laser manufactured through use of the known technique. Procedures through manufacture of an epitaxial wafer for a ridge laser and procedures through production of the thin gold film 13 are the same as in the first and second embodiments, and repeated explanations thereof are omitted. In relation to the structure of the device, elements which are the same as those described in connection with the first and second embodiments are assigned the same reference numerals, and illustration of the elements is omitted. Only the area around the structure of gold plating is shown in detail.

In the third embodiment, first gold plating 14, which is thinner (having a thickness of, e.g., 150 nm or thereabouts) than the related-art gold plating, is deposited over the entire thin gold film 13. Further, second gold plating 34 is formed partially (in the area other than the edge of the device), to the same thickness as that of the related-art gold plating 114 (i.e., to a thickness of 2000 to 3000 nm) and in the same structure as that of the related-art gold plating 114.

As a result, an open surface of the thin gold film 13 disappears, thereby avoiding generation of a path along which an excessive current flows to the thin gold film 13 and preventing a failure, which would otherwise be caused by fusion of the thin gold film 13.

The first gold plating 14, which is thinner than the related-art gold plating 114, is deposited at least a the edge of the device. Hence, even when the first gold plating 14 is deposited up to the edge of the device, cleaving of the edge of the device can be readily effected. Alternatively, the first gold plating 14 may be made thinner or both thinner and narrower than the related-art gold plating 114.

In the third embodiment, gold plating to be formed over the entire thin gold film 13 is not made thin; a thick portion is formed by addition of the second gold plating 34 to the first gold plating 14. There is yielded an advantage of ability to sufficiently realize ohmic contact between the electrode and the semicondoctor and ensure sufficient strength of the electrode.

FOURTH EMBODIMENT

Figure 4A:
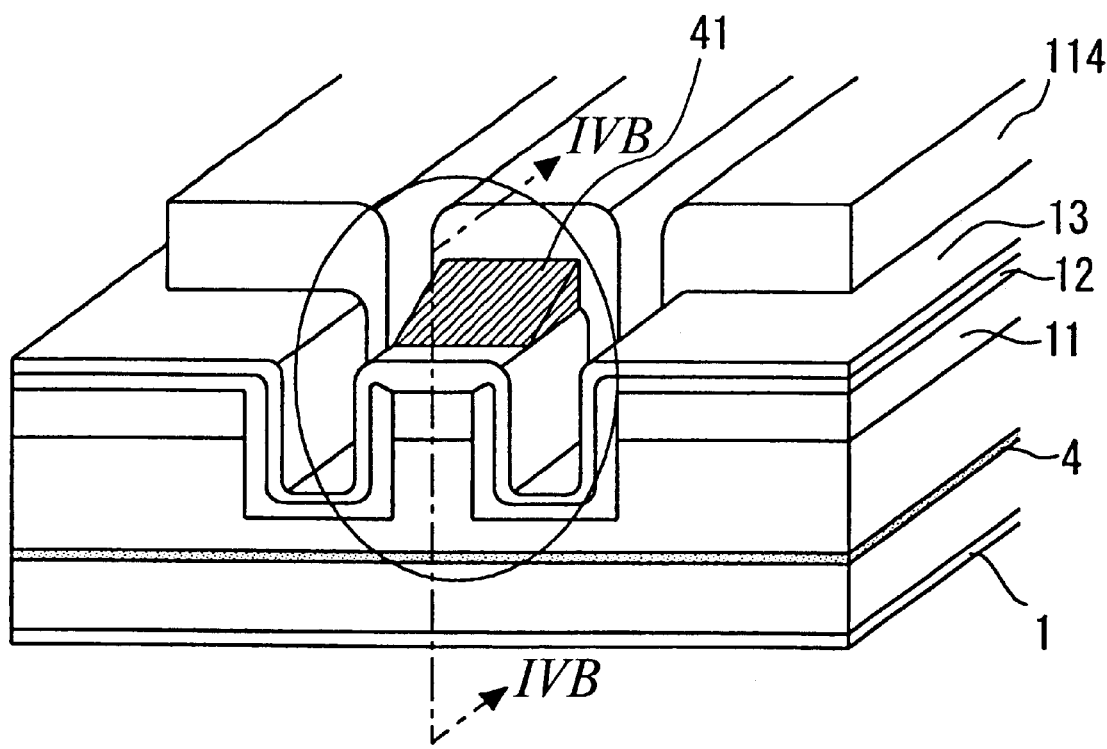
FIG. 4A is an illustration showing the structure of a semiconductor optical device according to a fourth embodiment and FIG. 4B is a detail view.
Figure 4B:
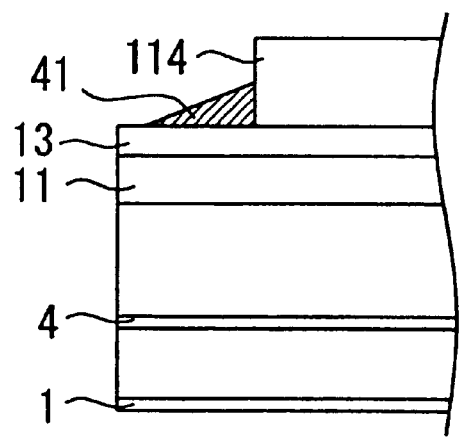

FIG. 4A is an illustration showing the structure of a semiconductor optical device according to a fourth embodiment of the present invention. FIG. 4B is a cross-sectional view taken along line IVB—IVB of FIG. 4A. The semiconductor optical device shown in FIG. 4A is a ridge waveguide semiconductor laser manufactured through use of the known technique. Procedures through manufacture of an epitaxial wafer for a ridge laser and procedures through production of the gold plating 114 are the same as those in the related-art technique.

In the fourth embodiment, there is prevented generation of a path along which an excessive current arising in an open surface of the thin gold film 13 flows. Hence, conductive material 41 is formed on the open surace of the thin gold film 13. For instance, material primarily containing gold is deposited on the open surface. In the present embodiment, when the conductive material 41 is formed on the thin gold film 13, the conductive material 41 is tapered from the upper portion of the ridge to the edge of the device such that the edge of the device assumes a thickness of, e.g., 150 nm or less.

That is, the present invention proposes a method of manufacturing a semiconductor device which operates by inflow of an electric current from an electrode. The electrode of the device is formed as follows. First, gold-containing plating is formed on a gold-containing thin film except the edge portion of the thin film. Then, conductive material is added, in a way to continue from the plating, on the edge portion of the thin film.

As a result, the open surface of the thin gold film 13 disappears, thereby preventing occurrence of a failure, which would otherwise be caused by fusion of the thin gold film 13. Further, since the conductive material 41 at least at the edge of the device is made sufficiently thin, even when the conductive material 41 is deposited up to the edge of the device, cleaving of the edge of the device can be readily effected.

In the fourth embodiment, the gold plating 114 having the same thickness as that of the related-art gold plating is deposited in the area on the thin gold film 13 other than the edge of the device. There is also yielded an advantage of ability to realize ohmic contact between the electrode and the semiconductor and ensure sufficient strength of the electrode structure.

The previous embodiments show only some embodiments of the present invention, but the technical scope of the present invention is not to be interpreted limitedly by the embodiments. The present invention can be embodied in various forms without departing from the spirit or principal features of the invention.

The present invention employs the electrode structure set forth, thus eliminating, from a thin film, an area at which an electric current excessively concentrates and preventing occurrence of a failure, which would otherwise be caused by fusion of the electrode.

In other embodiments of the present invention, plating formed at least at the edge of the device is formed thinner than the related-art plating. Even when the plating is deposited up to the edge of the device, cleaving of the edge of the device can be effected readily.

The electrode structure according to the present invention can be generally applied to an optical device and an electronic device. The present invention can be expected to show a distinguished effect particularly when applied to an electrode of an optical device having a large inflow current.

It is further understood that the foregoing description is a preferred embodiment of the disclosed device and that various changes and modifications may be made in the invention without departing from the spirit and scope thereof.

The entire disclosure of a Japanese Patent Application No.2001-041188, filed on Feb. 19, 2001 including specification, claims, drawings and summary, on which the Convention priority of the present application is based, are incorporated herein by reference in its entirety.

What is claimed is:

1. A semiconductor device which operates in response to an electric current flowing through an electrode having a gold-containing thin film and a gold-containing plated film on the thin film, wherein the thin film is entirely covered by the plated film, the plated film has a thickness that varies with position, and the plated film at an edge of the device proximate a cleaved face of the semiconductor device is thinner than the plated film elsewhere.

2. The semiconductor device according to claim 1, wherein the semiconductor device is a ridge waveguide semiconductor laser.

3. The semiconductor device according to claim 1, wherein the plated film at the edge has a thickness less than 2000 nm.

4. A semiconductor device which operates in response to an electric current flowing through an electrode having a gold-containing thin film and a gold-containing plated film on the thin film, wherein the thin film is entirely covered by the plated film, the plated film has a thickness that varies with position and is thinner at an edge of the device than elsewhere, and the plated film at the edge of the device has a thickness less than 2000 nm.

5. The semiconductor device according to claim 4, wherein the semiconductor device is a ridge waveguide semiconductor laser.

6. A semiconductor device which operates in response to an electric current flowing through an electrode having a gold-containing thin film and a gold-containing plated film on the thin film wherein the thin film is entirely covered by the plated film, and the plated film includes a first plating which has a thickness less than 2000 nm and covers all of the thin film, and a second plating partially covering the first plating.

7. The semiconductor device according to claim 6, wherein the first plating, but not the second plating, is present at the edge of the device.

8. The semiconductor device according to claim 6, wherein the semiconductor device is a ridge waveguide semiconductor laser.

9. A semiconductor device which operates in response to an electric current flowing through an electrode having a gold-containing thin film and a gold-containing plated film on the thin film, wherein the thin film is covered with the plated film except adjacent an edge portion of the thin film, and including a body of a conductive material disposed on the thin film, contacting the plated film, having a varying thickness in cross-section and tapering from a thinned portion proximate the edge portion of the thin film to a thickest part at the plated film.

10. The semiconductor device according to claim 9, wherein the conductive material is, at least at an edge of the device, thinner than the plated film.

11. The semiconductor device according to claim 9, wherein the semiconductor device is a ridge waveguide semiconductor laser.

* * * * *